(12) United States Patent
Zhang et al.

(10) Patent No.: US 12,119,083 B2
(45) Date of Patent: Oct. 15, 2024

(54) DRIVE CIRCUIT, METHOD FOR DRIVING DRIVE CIRCUIT, AND MEMORY

(71) Applicant: CHANGXIN MEMORY TECHNOLOGIES, INC., Hefei (CN)

(72) Inventors: Shuhao Zhang, Hefei (CN); Ning Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 141 days.

(21) Appl. No.: 17/874,813

(22) Filed: Jul. 27, 2022

(65) Prior Publication Data

US 2023/0368827 A1    Nov. 16, 2023

Related U.S. Application Data

(63) Continuation of application No. PCT/CN2022/094531, filed on May 23, 2022.

(30) Foreign Application Priority Data

May 13, 2022   (CN) .......................... 202210521954.1

(51) Int. Cl.
G11C 11/08    (2006.01)
G11C 7/10     (2006.01)
G11C 7/12     (2006.01)
G11C 8/08     (2006.01)
G11C 11/408   (2006.01)
G11C 11/4096  (2006.01)
H03K 3/356    (2006.01)

(52) U.S. Cl.
CPC ............. *G11C 8/08* (2013.01); *G11C 7/1096* (2013.01); *G11C 7/12* (2013.01); *G11C 11/4085* (2013.01); *G11C 11/4096* (2013.01); *H03K 3/356113* (2013.01)

(58) Field of Classification Search
CPC ... G11C 8/08; G11C 11/4085; G11C 11/4096; G11C 7/12; G11C 7/1096; H03K 3/356113
USPC .......................................... 365/143
See application file for complete search history.

(56) References Cited

U.S. PATENT DOCUMENTS 5,946,229 A    8/1999   Kobatake
6,107,836 A    8/2000   Kawahara
(Continued)

FOREIGN PATENT DOCUMENTS

CN    1339160 A      3/2002
CN    101110263 A    1/2008
(Continued)

*Primary Examiner* — Tha-O H Bui
(74) *Attorney, Agent, or Firm* — Syncoda LLC; Feng Ma

(57) ABSTRACT

A drive circuit, a method for driving the drive circuit and a memory are provided. The drive circuit includes a word line drive circuit and a first control circuit. The word line drive circuit includes an input terminal, an output terminal and at least one N-type transistor. The word line drive circuit is configured to provide an output signal to the output terminal according to an input signal received by the input terminal. The first control circuit is configured to pull down, in response to the input signal being a first control signal, a voltage of a substrate terminal of the at least one N-type transistor in the word line drive circuit, to reduce a leakage current of the at least one N-type transistor.

19 Claims, 8 Drawing Sheets

(56) References Cited

U.S. PATENT DOCUMENTS

| | | | |
|---|---|---|---|
| 6,404,243 B1* | 6/2002 | Koch, II | H03K 19/0013 |
| | | | 327/107 |
| 6,614,684 B1 | 9/2003 | Shukuri | |
| 7,511,533 B1* | 3/2009 | O | H03K 19/01721 |
| | | | 326/83 |
| 7,911,748 B1* | 3/2011 | Chu | H01L 27/0266 |
| | | | 361/11 |
| 2001/0006352 A1* | 7/2001 | Toyoyama | H03K 19/0016 |
| | | | 327/534 |
| 2002/0006054 A1 | 1/2002 | Shukuri | |
| 2002/0126521 A1 | 9/2002 | Shukuri | |
| 2004/0004894 A1 | 1/2004 | Shukuri | |
| 2004/0190339 A1 | 9/2004 | Shukuri | |
| 2005/0232008 A1 | 10/2005 | Shukuri | |
| 2006/0202274 A1 | 9/2006 | Shukuri | |
| 2006/0221688 A1 | 10/2006 | Shukuri | |
| 2007/0140037 A1 | 6/2007 | Khamesra | |
| 2008/0037323 A1 | 2/2008 | Shukuri | |
| 2010/0013519 A1* | 1/2010 | Yoshii | H03K 19/20 |
| | | | 326/112 |
| 2011/0242926 A1 | 10/2011 | Mazure | |
| 2012/0250444 A1 | 10/2012 | Mazure | |
| 2014/0169058 A1* | 6/2014 | Mochida | G11C 8/18 |
| | | | 365/72 |
| 2014/0225648 A1 | 8/2014 | Mazure | |
| 2021/0335195 A1 | 10/2021 | Xian et al. | |
| 2022/0319391 A1 | 10/2022 | Xian et al. | |

FOREIGN PATENT DOCUMENTS

| | | |
|---|---|---|
| CN | 102214483 A | 10/2011 |
| CN | 103843066 A | 6/2014 |
| CN | 105810247 A | 7/2016 |
| CN | 208141792 U | 11/2018 |
| WO | 2022042014 A1 | 3/2022 |

* cited by examiner

DRIVE CIRCUIT, METHOD FOR DRIVING DRIVE CIRCUIT, AND MEMORY

CROSS-REFERENCE TO RELATED APPLICATIONS

This is a continuation application of International Patent Application No. PCT/CN2022/094531, filed on May 23, 2022, which claims priority to Chinese Patent Application No. 202210521954.1 filed on May 13, 2022. The disclosures of these applications are hereby incorporated by reference in their entireties.

BACKGROUND

A memory includes a word line drive circuit (SWD), and the word line drive circuit outputs a high-level signal or a low-level signal to a memory cell in the memory through a word line, thereby implementing the read-write operation of the memory cell.

When the word line is in a high-level state for a long time, if the leakage current of an N-type transistor in the word line drive circuit is too large, the high-level signal output by the word line drive circuit may not reach the word line effectively, and thus the memory cell may not be effectively driven to read and write, thereby affecting the performance of the memory.

SUMMARY

The disclosure relates to, but is not limited to, a drive circuit, a method for driving the drive circuit and a memory.

According to a first aspect, the disclosure provides a drive circuit, which may include a word line drive circuit and a first control circuit.

The word line drive circuit may include an input terminal and an output terminal. The word line drive circuit is configured to provide an output signal to the output terminal according to an input signal received by the input terminal. The word line drive circuit includes at least one N-type transistor.

The first control circuit is configured to pull down, in response to the input signal being a first control signal, a voltage of a substrate terminal of the at least one N-type transistor to reduce a leakage current of the at least one N-type transistor.

According to a second aspect, the present disclosure provides a memory. The memory may include the drive circuit in first aspect and any possible implementation mode of the first aspect.

According to a third aspect, the present disclosure provides a method for driving the drive circuit in first aspect and any possible implementation mode of the first aspect. The method may include the following operations.

An input signal is provided to an input terminal of a word line drive circuit, to enable an output terminal of the word line drive circuit to provide an output signal.

In response to the input signal being a first control signal, a voltage of a substrate terminal of the at least one N-type transistor is pulled down, to reduce a leakage current of the at least one N-type transistor.

The embodiments of the disclosure provide a drive circuit, which may include a word line drive circuit and a first control circuit. The word line drive circuit includes an input terminal, an output terminal and at least one N-type transistor. The word line drive circuit is configured to provide an output signal to the output terminal according to an input signal received by the input terminal. The first control circuit is configured to pull down, in response to the input signal being a first control signal, the voltage of the substrate terminal of the at least one N-type transistor in the word line drive circuit, so as to reduce the leakage current of the at least one N-type transistor and improve the leakage of the N-type transistor in the word line drive circuit, thereby enabling a high-level signal output by the word line drive circuit to effectively reach the word line and further improving the performance of the memory.

BRIEF DESCRIPTION OF THE DRAWINGS

The accompanying drawings, which are incorporated in and constitute a part of this specification, illustrate embodiments consistent with the disclosure and, together with the specification, serve to explain the principles of the disclosure.

The specific embodiments of the disclosure have been described through the described drawings, and more detailed descriptions for the embodiments will be made later. These drawings and text are not intended to limit the scope of the disclosure in any way, but to explain concepts of the disclosure to persons skilled in the art with reference to the specific embodiments.

DETAILED DESCRIPTION

Exemplary embodiments will be described here in detail, and examples thereof are represented in the accompanying drawings. When the following description relates to the accompanying drawings, unless otherwise indicated, the same numbers in different accompanying drawings represent the same or similar elements. Implementations described in the following exemplified embodiments do not represent all implementations consistent with the disclosure. On the contrary, they are only examples for apparatuses and methods consistent in same aspects of the disclosure as detailed in the attached claims.

After considering the specification and practicing the implementations of the present disclosure, a person skilled in the art may easily conceive of other implementations of the disclosure. The disclosure is intended to cover any variations, uses, or adaptive changes of this disclosure. These variations, uses, or adaptive changes follow the general principles of the disclosure and include common general knowledge or common technical means in the art, which are not disclosed in the disclosure. The specification and embodiments are merely considered to be exemplary, and the actual scope and spirit of the disclosure are indicated in the following claims.

Figure 1:
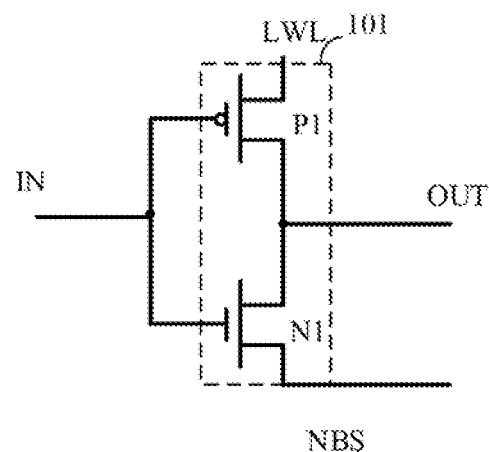
FIG. 1 is a circuit diagram of a word line drive circuit according to an embodiment of the disclosure.

FIG. 1 is a circuit diagram of a word line drive circuit according to an embodiment of the present disclosure. As shown in FIG. 1, the word line drive circuit 101 includes an N-type Metal Oxide Semiconductor (NMOS) transistor or a P-type Metal Oxide Semiconductor (PMOS) transistor. A gate electrode of the first N-type transistor N1 and a gate electrode of the first P-type transistor P1 are connected to each other as an input terminal IN of the word line drive circuit 101, and the input terminal IN of the word line drive circuit 101 is connected to a main word line MWL for receiving an input signal provided by the main word line MWL. A first electrode of the first P-type transistor P1 and a first electrode of the first N-type transistor N1 are connected to each other as an output terminal OUT of the word line drive circuit 101. The output terminal OUT of the word line drive circuit 101 is connected to a word line WL, and the word line drive circuit 101 outputs a high-level signal or a low-level signal to the word line WL under the action of the input signal.

A second electrode of the first P-type transistor P1 is connected to a first signal terminal LWL. In the case where the input signal is a first control signal (for example, a low-level signal), the first N-type transistor N1 is turned off the first P-type transistor P1 is turned on, the first signal terminal LWL provides a first voltage (for example, the first voltage is a high level), and then the word line drive circuit 101 outputs a high-level signal to the word line WL. A second electrode of the first N-type transistor N1 is connected to a second signal terminal NBS. In the case where the input signal is a second control signal (for example, a high-level signal), the first P-type transistor P1 is turned of, the first N-type transistor N1 is turned on, the second signal terminal NBS provides a second voltage (for example, the second voltage is a low level), and then the word line drive circuit 101 outputs a low-level signal to the word line WL. Therefore, a memory cell may be driven to read and write via the word line WL. For example, in the present disclosure, the first electrode may be a drain and the second electrode may be a source electrode. Alternatively, the first electrode may be a source and the second electrode may be a drain electrode.

Figure 2:
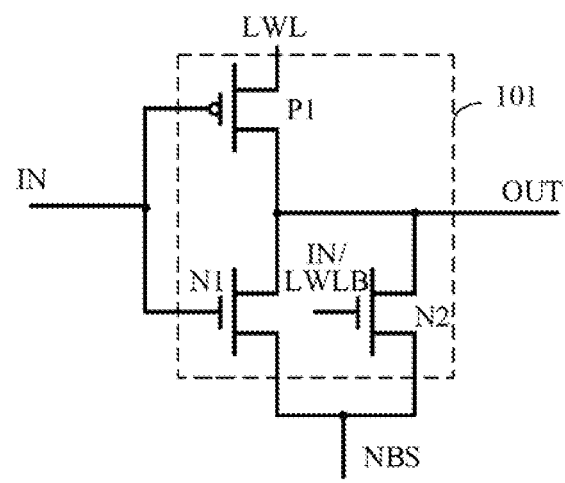
FIG. 2 is a circuit diagram of a word line drive circuit according to an embodiment of the disclosure.

FIG. 2 is a circuit diagram of another word line drive circuit according to an embodiment of the present disclosure. As shown in FIG. 2, the word line drive circuit 101 includes two NMOS transistors and one PMOS transistor. A gate electrode of the first N-type transistor N1 and a gate electrode of the first P-type transistor P1 are connected to each other as the input terminal IN of the word line drive circuit 101, and a first electrode of the first P-type transistor P1, a first electrode of the first N-type transistor N1 and a first electrode of the second N-type transistor N2 are connected to one another as the output terminal OUT of the word line drive circuit 101. A gate electrode of the second N-type transistor N2 is connected to the input terminal IN or a control signal terminal LWLB of the word line drive circuit 101. In the case where the gate electrode of the second N-type transistor N2 is connected to the control signal terminal LWLB, the control signal terminal LWLB can increase the turn-on speed of the second N-type transistor N2.

A second electrode of the first P-type transistor P1 is connected to a first signal terminal LWL. If the gate electrode of the second N-type transistor N2 is connected to the input terminal IN of the word line drive circuit 101 and the input signal is the first control signal, the first N-type transistor N1 and the second N-type transistor N2 are turned off, the first P-type transistor P1 is turned on, and the first signal terminal LWL provides a first voltage. If the gate electrode of the second N-type transistor N2 is connected to the control signal terminal LWLB and the input signal is the first control signal, the first N-type transistor N1 is turned off, the first P-type transistor P1 is turned on, and simultaneously, the control signal terminal LWLB provides a third control signal (for example, a low-level signal). The third control signal is in phase with the input signal at this time (for example, the duty ratio of the third control signal is the same as or slightly different from the duty ratio of the first control signal), the second N-type transistor N2 is turned off under the action of the third control signal, and the first signal terminal LWL provides the first voltage.

A second electrode of the first N-type transistor N1 is connected to a second electrode of the second N-type transistor N2 and then connected to a second signal terminal NBS. If the gate electrode of the second N-type transistor N2 is connected to the input terminal IN of the word line drive circuit 101 and the input signal is the second control signal, the first P-type transistor P1 is turned off, the first N-type transistor N1 and the second N-type transistor N2 are turned on, and the first signal terminal LWL provides a first voltage. If the gate electrode of the second N-type transistor N2 is connected to the control signal terminal LWLB and the input signal is the second control signal, the first P-type transistor P1 is turned off, the first N-type transistor N1 is turned on, and simultaneously, the control signal terminal LWLB provides a fourth control signal (for example, a high-level signal). The fourth control signal is in phase with the input signal at this time (for example, the duty ratio of the fourth control signal is the same as or slightly different from the duty ratio of the second control signal). Then the second N-type transistor N2 is turned on under the action of the fourth control signal, and the first N-type transistor N1 and the second N-type transistor N2 are turned on, so that the voltage of the word line WL can be pulled down faster, and the word line is effectively turned off.

FIGS. 3-6 are circuit diagrams of a drive circuit according to an embodiment of the present disclosure. As shown in FIGS. 3-6, an embodiment of the disclosure provides a drive circuit, including a word line drive circuit 101 and a first control circuit 102. The word line drive circuit 101 includes an input terminal IN, an output terminal OUT and at least one N-type transistor. The word line drive circuit 101 is configured to provide an output signal to the output terminal OUT according to an input signal received by the input terminal IN. The first control circuit 102 is configured to pull down, in the case where the input signal is a first control signal, a voltage of a substrate terminal (also referred to as "back gate terminal") of the at least one N-type transistor, to reduce a leakage current of the at least one N-type transistor. Therefore, the electrical performance of the N-type transistor may be improved, so that the high-level signal output by the word line drive circuit can effectively reach the word line, leakage of a burn-in test in a chip probing (CP) process is improved, the availability of the burn-in test is improved, and one or more invalid cells in the memory are eliminated more effectively. As shown in Table 1, generally, the smaller the voltage VB of the substrate terminal of the N-type transistor is, the smaller the leakage current Ioff of the N-type transistor is.

TABLE 1

| VB (V) | Vt (V) | Ioff (nA) |
|---|---|---|
| 0 | 0.68 | 232 |
| −0.2 | 0.71 | 49 |
| −0.7 | 0.75 | 30 |
| −1 | 0.76 | 20 |

In some embodiments, the first control circuit 102 includes a second P-type transistor P2. A gate electrode of the second P-type transistor P2 is connected to the input terminal IN of the word line drive circuit 101, a first electrode is connected to the substrate terminal of the at least one N-type transistor, and a second electrode is connected to a third signal terminal VNB. The third signal terminal VNB is configured to provide a third voltage in the case where the second P-type transistor P2 is turned on. In the case where the input signal received by the input terminal of the word line drive circuit 101 is the first control signal, the second P-type transistor P2 is turned on, and the third signal terminal VNB provides the third voltage to the substrate terminal of the at least one N-type transistor. The third voltage is a low voltage, thereby pulling down the voltage of the substrate terminal of the at least one N-type transistor and reducing the leakage current of the at least one N-type transistor. For example, the third voltage may be lower than zero voltage, thereby rapidly pulling down the voltage of the substrate terminal of the at least one N-type transistor.

Figure 3:
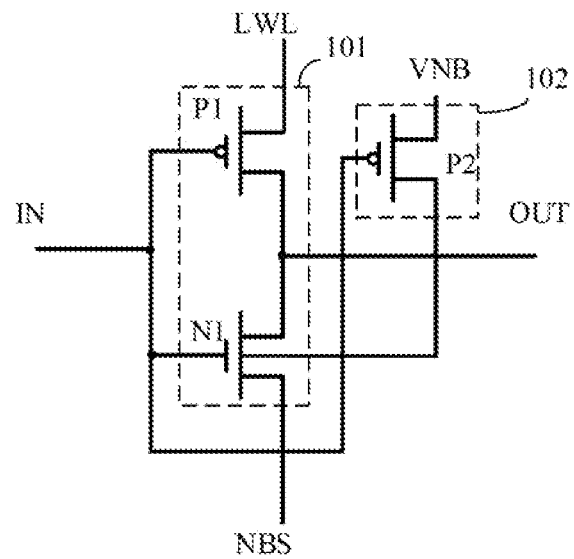
FIG. 3 is a circuit diagram of a drive circuit according to an embodiment of the present disclosure.

As shown in FIG. 3, the word line drive circuit 101 includes a first P-type transistor P1 and a first N-type transistor N1, and the first control circuit 102 includes a second P-type transistor P2. The gate electrode of the first P-type transistor P1 and the gate electrode of the first N-type transistor N1 are connected to each other as the input terminal IN of the word line drive circuit 101, the first electrode of the first P-type transistor P1 and the first electrode of the first N-type transistor N1 are connected to each other as the output terminal OUT of the word line drive circuit 101, and the first electrode of the second P-type transistor P2 is connected to the substrate terminal of the first N-type transistor N1, so that the voltage of the substrate terminal of the first N-type transistor N1 can be reduced and the leakage current of the first N-type transistor N1 is reduced. The second electrode of the first P-type transistor P1 is connected to the first signal terminal LWL, and the second electrode of the first N-type transistor N1 is connected to the second signal terminal NBS. The first signal terminal LWL is configured to provide a first voltage in the case where the first P-type transistor P1 is turned on, thereby providing a high-level signal to the output terminal OUT. The second signal terminal NBS is configured to provide a second voltage in the case where the first N-type transistor N1 is turned on, so as to provide a low-level signal to the output terminal OUT. That is, the first voltage is greater than the second voltage.

In the case where the input signal received by the input terminal IN of the word line drive circuit 101 is the first control signal, the first N-type transistor N1 is turned off, the first P-type transistor Pt and the second P-type transistor P2 are turned on, and the first signal terminal LWL provides the first voltage to the output terminal OUT of the word line drive circuit 101. Simultaneously, the third signal terminal VNB provides a third voltage to the substrate terminal of the first N-type transistor N1, thereby pulling down the voltage of the substrate terminal of the first N-type transistor N1, reducing the leakage current of the first N-type transistor, and enabling the first voltage provided by the first signal terminal LWL to effectively reach the word line WL connected with the output terminal OUT.

Figure 4:
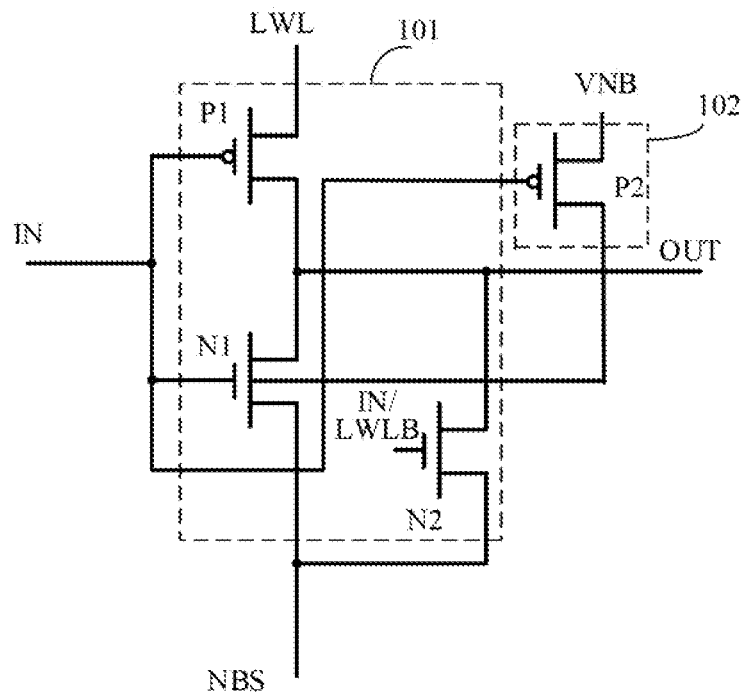
FIG. 4 is a circuit diagram of a drive circuit according to an embodiment of the present disclosure.
Figure 5:
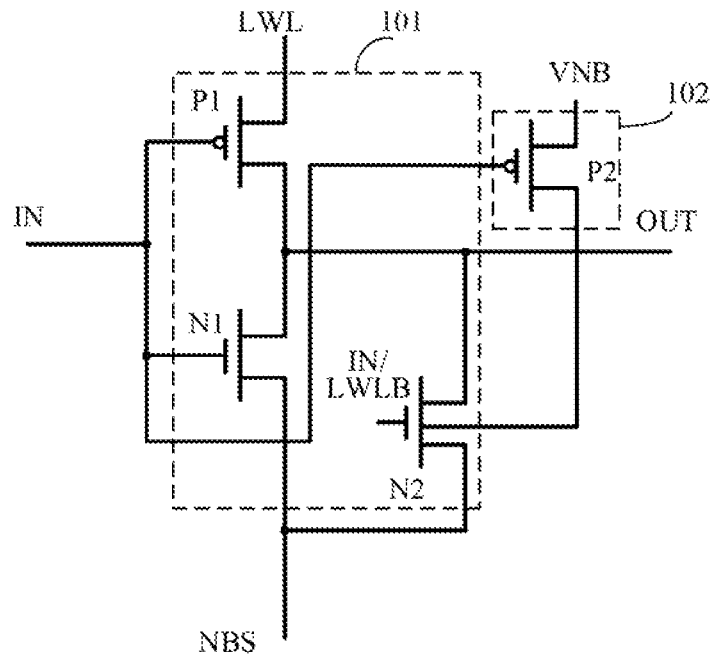
FIG. 5 is a circuit diagram of a drive circuit according to an embodiment of the present disclosure.
Figure 6:
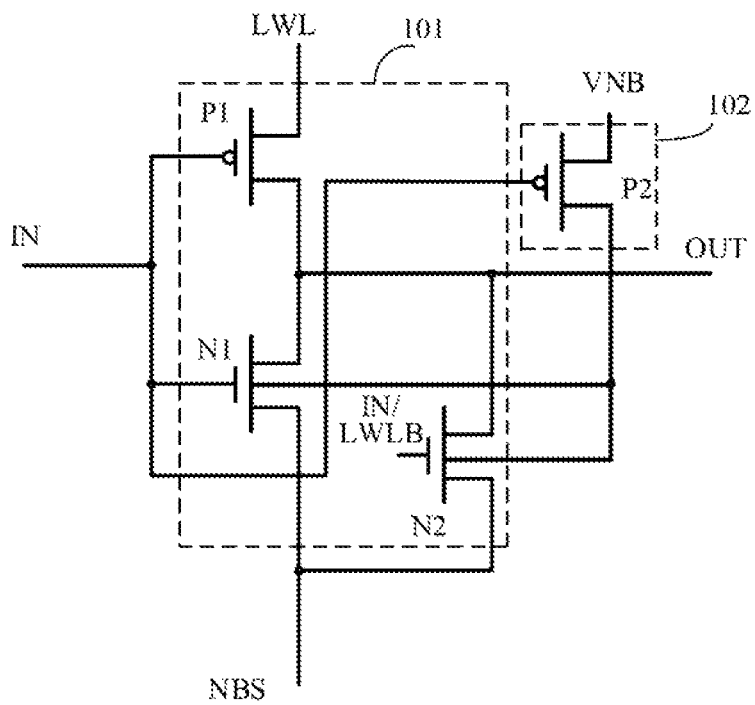
FIG. 6 is a circuit diagram of a drive circuit according to an embodiment of the present disclosure.

As shown in FIGS. 4-6, the word line drive circuit 101 includes a first P-type transistor P1, a first N-type transistor N1 and a second N-type transistor N2. The first electrode of the second N-type transistor N2 is connected to the output terminal OUT of the word line drive circuit 101. The second electrode of the second N-type transistor N2 is connected to the second electrode of the first N-type transistor N1. The gate electrode of the second N-type transistor N2 is connected to the input terminal IN or the control signal terminal LWLB of the word line drive circuit 101. The first control circuit 102 includes a second P-type transistor P2, and the first electrode of the second P-type transistor P2 is connected to the substrate terminal of the first N-type transistor N1 and/or the substrate terminal of the second N-type transistor N2. In the case where the input signal is the first control signal, the second P-type transistor P2 is turned on, the voltage of the substrate terminal of the first N-type transistor N1 and/or the second N-type transistor N2 is pulled down, so as to reduce the leakage current of the first N-type transistor N1 and/or the second N-type transistor N2.

As shown in FIG. 4, in the case where the first electrode of the second P-type transistor P2 is connected to the substrate terminal of the first N-type transistor N1, and the input signal is the first control signal, the first N-type transistor N1 is turned off, the first P-type transistor P1 and the second P-type transistor P2 are turned on, the first signal terminal LWL provides the first voltage to the output terminal OUT of the word line drive circuit 101, and the third signal terminal VNB provides the third voltage to the substrate terminal of the first N-type transistor N1, thereby pulling down the voltage of the substrate terminal of the first N-type transistor N1, reducing the leakage current of the first N-type transistor N1, and enabling the first voltage provided by the first signal terminal LWL to effectively reach the word line WL connected with the output terminal OUT.

As shown in FIG. 5, the first electrode of the second P-type transistor P2 is connected to the substrate terminal of the second N-type transistor N2. In the case where the gate electrode of the second N-type transistor N2 is connected to the input terminal IN of the word line drive circuit 101 and the input signal is the first control signal, the first N-type transistor N1 and the second N-type transistor N2 are turned off, the first P-type transistor P1 and the second P-type transistor P2 are turned on, the first signal terminal LWL provides the first voltage to the output terminal OUT of the word line drive circuit 101, and the third signal terminal VNB provides the third voltage to the substrate terminal of the second N-type transistor N2, thereby pulling down the voltage of the substrate terminal of the second N-type transistor N2, reducing the leakage current of the second N-type transistor N2, and enabling the first voltage provided by the first signal terminal LWL to effectively reach the word line WL connected with the output terminal OUT. In the case where the gate electrode of the second N-type transistor N2 is connected to the control signal terminal LWLB, the control signal terminal LWLB is configured to provide a control signal in phase with the input signal (for example, the control signal includes a third control signal and a fourth control signal described in the disclosure). In the case where the input signal is the first control signal, the first N-type transistor N1 is turned off, the first P-type transistor P1 and the second P-type transistor P2 are turned on, the second N-type transistor N2 is turned off under the action of the third control signal provided by the control signal terminal LWLB, the first signal terminal LWL provides the first voltage to the output terminal OUT, and the third signal terminal VNB provides the third voltage to the substrate terminal of the second N-type transistor N2, thereby pulling down the voltage of the substrate terminal of the second N-type transistor N2, reducing the leakage current of the second N-type transistor N2, and enabling the first voltage provided by the first signal terminal LWL to effectively reach the word line WL connected with the output terminal OUT.

As shown in FIG. 6, the first electrode of the second P-type transistor P2 is connected to the substrate terminal of the first N-type transistor N1 and the substrate terminal of the second N-type transistor N2. If the gate electrode of the second N-type transistor N2 is connected to the input terminal IN of the word line drive circuit 101 and the input signal is the first control signal, the first N-type transistor N1 and the second N-type transistor N2 are turned off, and the first P-type transistor P1 and the second P-type transistor P2 are turned on. The first signal terminal LWL provides the first voltage to the output terminal OUT, and the third signal terminal VNB provides the third voltage to the substrate terminals of the first N-type transistor N1 and the second N-type transistor N2, thereby pulling down the voltage of the substrate terminals of the first N-type transistor N1 and the second N-type transistor N2, reducing the leakage current of the first N-type transistor N1 and the second N-type transistor N2, and enabling the first voltage provided by the first signal terminal LWL to effectively reach the word line WL connected to the output terminal OUT.

If the gate electrode of the second N-type transistor N2 is connected to the control signal terminal LWLB, and the input signal is the first control signal, the first N-type transistor N1 is turned off, the first P-type transistor P1 and the second P-type transistor P2 are turned on, the control signal terminal LWLB provides the third control signal to enable the second N-type transistor N2 to be turned off, the first signal terminal LWL provides the first voltage to the output terminal OUT, and the third signal terminal VNB provides the third voltage to the substrate terminals of the first N-type transistor N1 and the second N-type transistor N2, thereby pulling down the voltage of the substrate terminals of the first N-type transistor N1 and the second N-type transistor N2, reducing the leakage current of the first N-type transistor N1 and the second N-type transistor N2, and enabling the first voltage provided by the first signal terminal LWL to effectively reach the word line WL connected with the output terminal OUT.

FIGS. 7-10 are circuit diagrams of a drive circuit according to an embodiment of the present disclosure. As shown in FIGS. 7-10, the drive circuit includes a word line drive circuit 101, a first control circuit 102 and a second control circuit 103. The first control circuit 102 is configured to pull down, in the case where the input signal is a first control signal, a voltage of the substrate terminal of at least one N-type transistor to reduce a leakage current of the at least one N-type transistor. The second control circuit 103 is configured to pull up, in the case where the input signal is a second control signal, the voltage of the substrate terminal of the at least one N-type transistor to reduce the threshold voltage of the at least one N-type transistor. The level of the second control signal is different from that of the first control signal, so that the input terminal IN drives the first control circuit 102 or the second control circuit 103 to operate when receiving signals of different levels. The level of the first control signal is lower than that of the second control signal, so that the first control circuit 102 may be driven to operate in the case where the input signal received at the input terminal IN is the first control signal, and the second control circuit 103 may be driven to operate in the case where the input signal received at the input terminal IN is the second control signal.

In some embodiments, the second control circuit 103 includes a third N-type transistor N3. The gate electrode of the third N-type transistor N3 is connected to the input terminal IN of the word line drive circuit 101, the first electrode is connected to the substrate terminal of the at least one N-type transistor, and the second electrode is connected to a fourth signal terminal VG. The fourth signal terminal VG is configured to provide a fourth voltage in the case where the third N-type transistor N3 is turned on. In the case where the input signal is the second control signal, the third N-type transistor N3 is turned on, and the fourth signal terminal VG provides the fourth voltage to the substrate terminal of the at least one N-type transistor, thereby pulling up the voltage of the substrate terminal of the at least one N-type transistor and reducing the threshold voltage of the at least one N-type transistor. As shown in Table 1, the larger the voltage of the substrate terminal VB of the N-type transistor is, the smaller the threshold voltage Vt of the N-type transistor is. The fourth voltage may be greater than the third voltage, so as to pull up the voltage of the substrate terminal of the at least one N-type transistor. For example, the fourth voltage may be zero voltage, but is not limited thereto.

Figure 7:
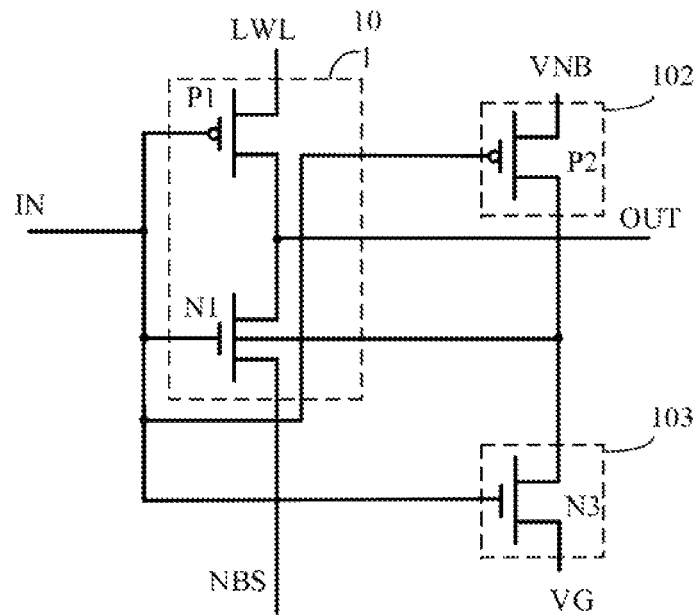
FIG. 7 is a circuit diagram of another drive circuit according to an embodiment of the present disclosure.

As shown in FIG. 7, the word line drive circuit 101 includes a first P-type transistor P1 and a first N-type transistor N1. In the case where the input signal is the first control signal, the first control circuit 102 pulls down the voltage of the substrate terminal of the first N-type transistor N1 to reduce the leakage current of the first N-type transistor N1. In the case where the input signal is the second control signal, the second control circuit 103 pulls up the voltage of the substrate terminal of the first N-type transistor N1 and reduces the threshold voltage of the first N-type transistor N1.

The first control circuit 102 includes a second P-type transistor P2, and the second control circuit 103 includes a third N-type transistor N3. The first electrode of the second P-type transistor P2 and the first electrode of the third N-type transistor N3 are both connected to the substrate terminal of the first N-type transistor N1. In the case where the input signal is the first control signal, the first N-type transistor N1 and the third N-type transistor N3 are turned off, the first P-type transistor P1 and the second P-type transistor P2 are turned on, and the third signal terminal VNB provides the third voltage to the substrate terminal of the first N-type transistor N1, thereby pulling down the voltage of the substrate terminal of the first N-type transistor N1 and reducing the leakage current of the first N-type transistor N1. In the case where the input signal is the second control signal, the first P-type transistor P1 and the second P-type transistor P2 are turned off, the first N-type transistor N1 and the third N-type transistor N3 are turned on, and the fourth signal terminal VG provides the fourth voltage to the substrate terminal of the first N-type transistor N1, thereby pulling up the voltage of the substrate terminal of the first N-type transistor N1 and reducing the threshold voltage of the first N-type transistor N1.

Figure 8:
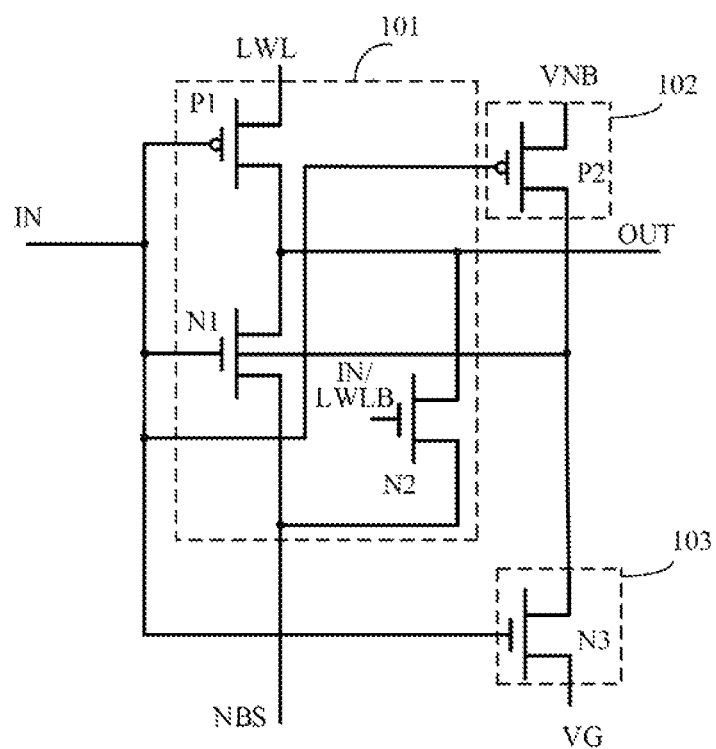
FIG. 8 is a circuit diagram of another drive circuit according to an embodiment of the present disclosure.
Figure 9:
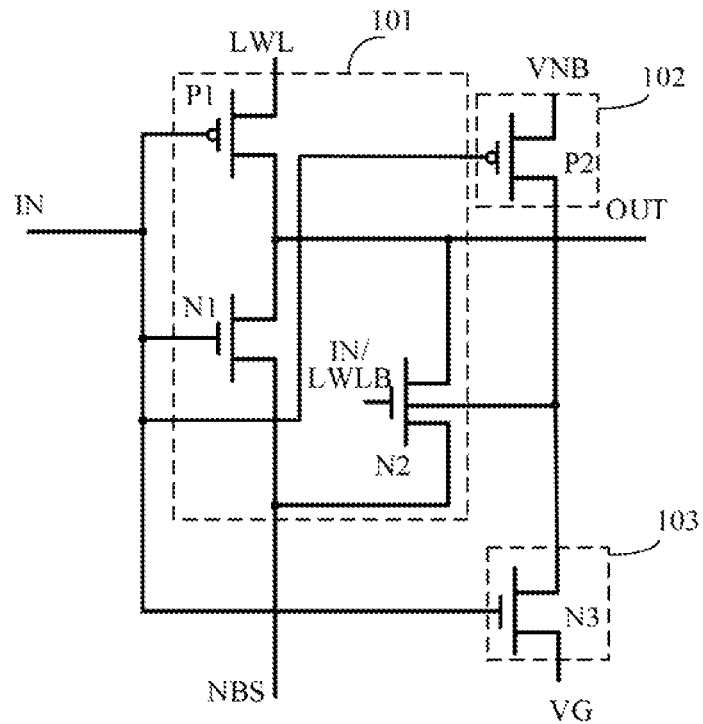
FIG. 9 is a circuit diagram of another drive circuit according to an embodiment of the present disclosure.
Figure 10:
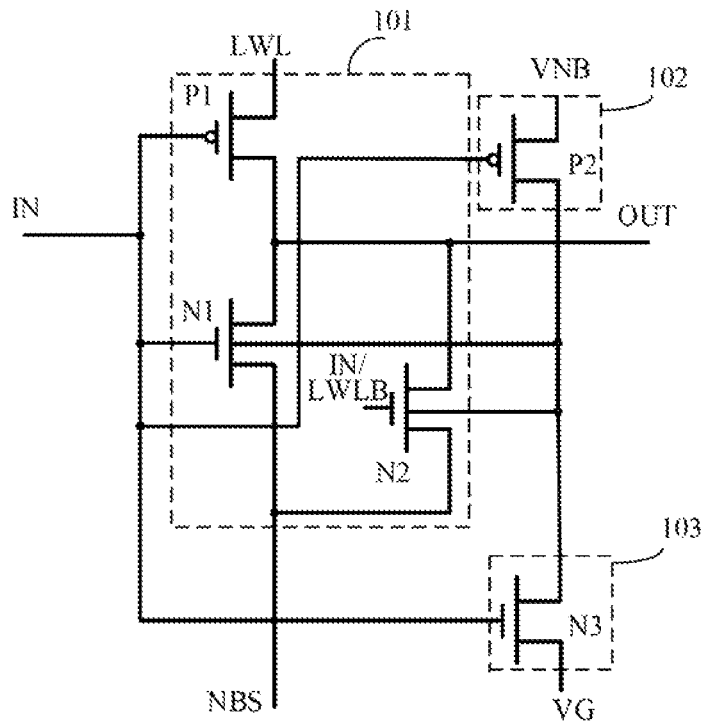
FIG. 10 is a circuit diagram of another drive circuit according to an embodiment of the present disclosure.

As shown in FIGS. 8-10, the word line drive circuit 101 includes a first P-type transistor P1, a first N-type transistor N1, and a second N-type transistor N2. The first electrode of the second P-type transistor P2 is connected to the substrate terminal of the first N-type transistor N1 and/or the substrate terminal of the second N-type transistor N2. In the case where the input signal is the first control signal, the first control circuit 102 pulls down the voltage of the substrate terminal of the first N-type transistor N1 and/or the voltage of the substrate terminal of the second N-type transistor N2, to reduce the leakage current of the first N-type transistor N1 and/or the second N-type transistor. The first electrode of third N-type transistor N3 is connected to the substrate terminal of the first N-type transistor N1 and/or the substrate terminal of the second N-type transistor N2. In the case where the input signal is the second control signal, the second control circuit 103 pulls up the voltage of the substrate terminal of the first N-type transistor N1 and/or the voltage of the substrate terminal of the second N-type transistor N2, and reduces the threshold voltages of the first N-type transistor N1 and/or the second N-type transistor N2.

As shown in FIG. 8, the first control circuit 102 includes a second P-type transistor P2, and the second control circuit 103 includes a third N-type transistor N3. The first electrode of the second P-type transistor P2 is connected to the substrate terminal of the first N-type transistor N1, and the first electrode of the third N-type transistor N3 is connected to the substrate terminal of the first N-type transistor N1. In the case where the input signal is the first control signal, the first N-type transistor N1 and the third N-type transistor N3 are turned off, the first P-type transistor P1 and the second P-type transistor P2 are turned on, and the third signal terminal VNB provides the third voltage to the substrate terminal of the first N-type transistor N1, thereby pulling down the voltage of the substrate terminal of the first N-type transistor N1 and reducing the leakage current of the first N-type transistor N1. In the case where the input signal is the second control signal, the first P-type transistor P1 and the second P-type transistor P2 are turned of, the first N-type transistor N1 and the third N-type transistor N3 are turned on, and the fourth signal terminal VG provides the fourth voltage to the substrate terminal of the first N-type transistor N1, thereby pulling up the voltage of the substrate terminal of the first N-type transistor N1 and reducing the threshold voltage of the first N-type transistor N1.

As shown in FIG. 9, the first electrode of the second P-type transistor P2 is connected to the substrate terminal of the second N-type transistor N2, and the first electrode of the third N-type transistor N3 is connected to the substrate terminal of the second N-type transistor N2. In the case where the input signal is the first control signal, the third N-type transistor N3 is turned off, the first P-type transistor P1 and the second P-type transistor P2 are turned on, the second N-type transistor N2 is turned off under the action of the first control signal or the third control signal, and the third signal terminal VNB provides the third voltage to the substrate terminal of the second N-type transistor N2, thereby pulling down the voltage of the substrate terminal of the second N-type transistor N2 and reducing the leakage current of the second N-type transistor N2. In the case where the input signal is the second control signal, the first P-type transistor P1 and the second P-type transistor P2 are turned off, the third N-type transistor N3 is turned on, the second N-type transistor N2 is turned on under the action of the second control signal or the fourth control signal, and the fourth signal terminal VG provides the fourth voltage to the substrate terminal of the second N-type transistor N2, thereby pulling up the voltage of the substrate terminal of the second N-type transistor N2 and reducing the threshold voltage of the second N-type transistor N2.

As shown in FIG. 10, the first electrode of the second P-type transistor P2 is connected to the substrate terminal of the first N-type transistor N1 and the substrate terminal of the second N-type transistor N2, and the first electrode of the third N-type transistor N3 is connected to the substrate terminal of the first N-type transistor N1 and the substrate terminal of the second N-type transistor N2. In the case where the input signal is the first control signal, the first N-type transistor N1 and the third N-type transistor N3 are turned off, the first P-type transistor P1 and the second P-type transistor P2 are turned on, the second N-type transistor N2 is turned off under the action of the first control signal or the third control signal, and the third signal terminal VNB provides the third voltage to the substrate terminal of the first N-type transistor N1 and the substrate terminal of the second N-type transistor N2, thereby pulling down the voltage of the substrate terminals of the first N-type transistor N1 and the second N-type transistor N2 and reducing the leakage current of the first N-type transistor N1 and the second N-type transistor N2. In the case where the input signal is the second control signal, the first P-type transistor P1 and the second P-type transistor P2 are turned off, the first N-type transistor N1 and the third N-type transistor N3 are turned on, the second N-type transistor N2 is turned on under the action of the second control signal or the fourth control signal, and the fourth signal terminal VG provides the fourth voltage to the substrate terminal of the first N-type transistor N1 and the substrate terminal of the second N-type transistor N2, thereby pulling up the voltage of the substrate terminals of the first N-type transistor N1 and the second N-type transistor N2 and reducing the threshold voltages of the first N-type transistor N1 and the second N-type transistor N2.

FIGS. 11-14 are circuit diagrams of a drive circuit according to an embodiment of the present disclosure. As shown in FIGS. 11-14, the drive circuit includes a word line drive circuit 101 and a second control circuit 103. The second control circuit 103 is configured to pull up, in the case where the input signal is the second control signal, a voltage of the substrate terminal of at least one N-type transistor to reduce a leakage voltage of the at least one N-type transistor.

Figure 11:
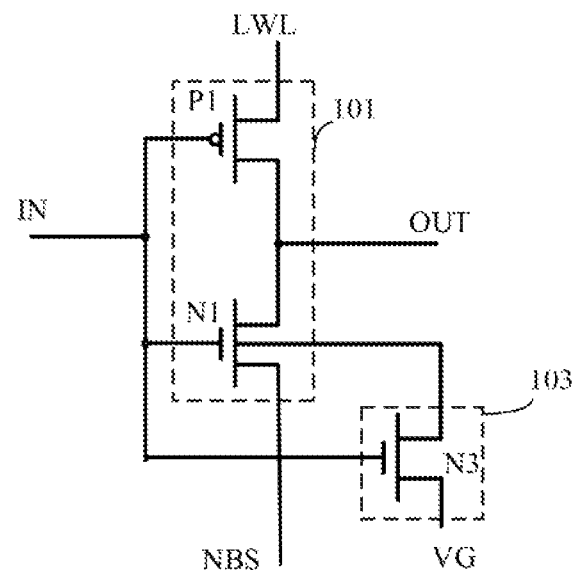
FIG. 11 is a circuit diagram of another drive circuit according to an embodiment of the present disclosure.

As shown in FIG. 11, the word line drive circuit 101 includes a first P-type transistor P1 and a first N-type transistor N1, and the second control circuit 103 includes a third N-type transistor N3. The gate electrode of the third N-type transistor N3 is connected to the input terminal IN of the word line drive circuit 101, and the first electrode of the third N-type transistor N3 is connected to the substrate terminal of the first N-type transistor N1. In the case where the input signal is the second control signal, the first P-type transistor P1 is turned off, the first N-type transistor N1 and the third N-type transistor N3 are turned on, and the fourth signal terminal VG provides the fourth voltage to the substrate terminal of the first N-type transistor N1, thereby pulling up the voltage of the substrate terminal of the first N-type transistor N1 and reducing the threshold voltage of the first N-type transistor N1.

Figure 12:
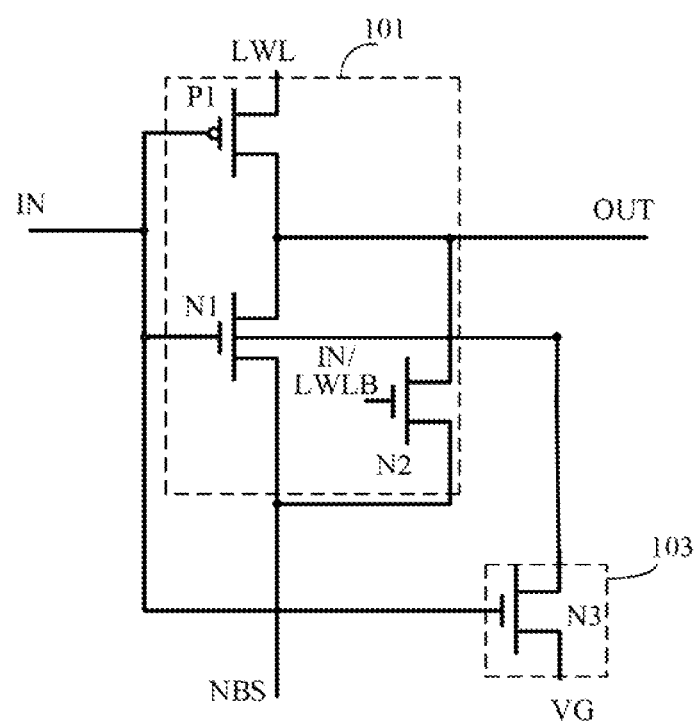
FIG. 12 is a circuit diagram of another drive circuit according to an embodiment of the present disclosure.
Figure 13:
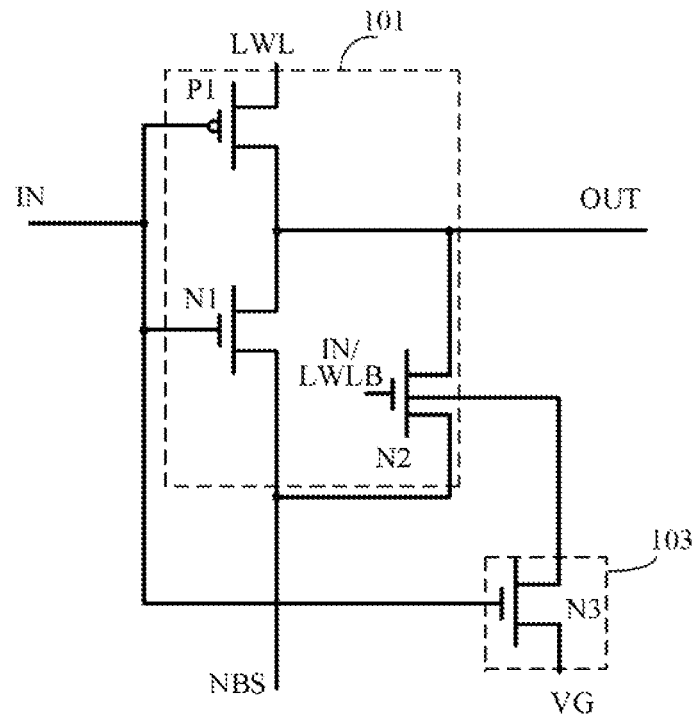
FIG. 13 is a circuit diagram of another drive circuit according to an embodiment of the present disclosure.
Figure 14:
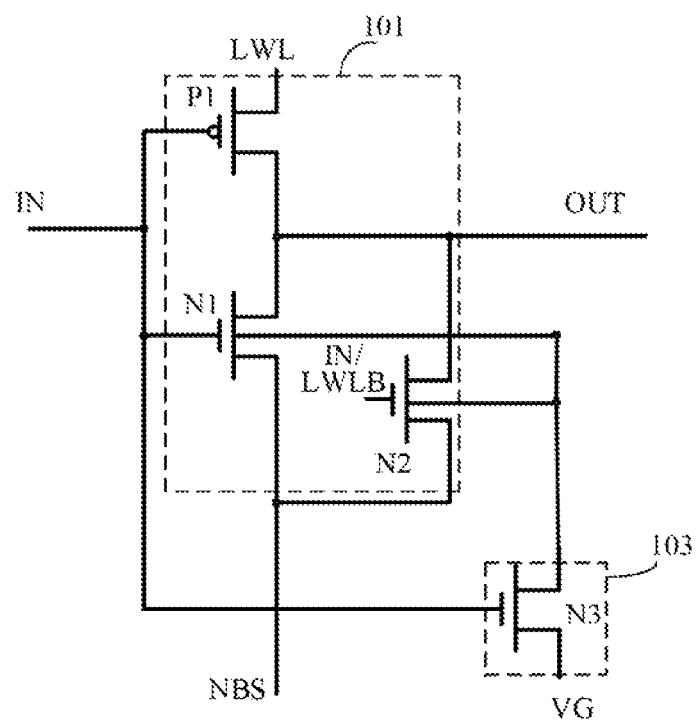
FIG. 14 is a circuit diagram of another drive circuit according to an embodiment of the present disclosure.

As shown in FIGS. 12-14, the word line drive circuit 101 includes a first P-type transistor P1, a first N-type transistor N1 and a second N-type transistor N2, and the second control circuit 103 includes a third N-type transistor N3. The first electrode of the third N-type transistor N3 is connected to the substrate terminal of the first N-type transistor N1 and/or the substrate terminal of the second N-type transistor N2. In the case where the input signal is the second control signal, the third N-type transistor N3 is turned on, the voltage of the substrate terminal of the first N-type transistor N1 and/or the voltage of the substrate terminal of the second N-type transistor N2 are pulled up, and the threshold voltage of the first N-type transistor N1 and/or the threshold voltage of the second N-type transistor N2 are reduced.

As shown in FIG. 12, the first electrode of the third N-type transistor N3 is connected to the substrate terminal of the first N-type transistor N1. In the case where the input signal is the second control signal, the first P-type transistor P1 is turned off, the first N-type transistor N1 and the third N-type transistor N3 are turned on, and the fourth signal terminal VG provides the fourth voltage to the substrate terminal of the first N-type transistor N1, thereby raising the voltage of the substrate terminal of the first N-type transistor N1 and reducing the threshold voltage of the first N-type transistor N1.

As shown in FIG. 13, the first electrode of the third N-type transistor N3 is connected to the substrate terminal of the second N-type transistor N2. In the case where the input signal is the second control signal, the first P-type transistor P1 is turned off, the third N-type transistor N3 is turned on, the second N-type transistor N2 is turned on under the action of the second control signal or the fourth control signal, and the fourth signal terminal VG provides the fourth voltage to the substrate terminal of the second N-type transistor N2, thereby raising the voltage of the substrate terminal of the second N-type transistor N2 and reducing the threshold voltage of the second N-type transistor N2.

As shown in FIG. 14, the first electrode of the third N-type transistor N3 is connected to the substrate terminal of the first N-type transistor N1 and the substrate terminal of the second N-type transistor N2. In the case where the input signal is the second control signal, the first P-type transistor P1 is turned off, the first N-type transistor N1 and the third N-type transistor N3 are turned on, the second N-type transistor N2 is turned on under the action of the second control signal or the fourth control signal, and the fourth signal terminal VG provides the fourth voltage to the substrate terminal of the first N-type transistor N1 and the substrate terminal of the second N-type transistor N2, thereby raising the voltage of the substrate terminals of the first N-type transistor N1 and the second N-type transistor N2 and reducing the threshold voltages of the first N-type transistor N1 and the second N-type transistor N2.

It is to be noted that the substrate terminal of the transistor may also be called a back gate electrode of the transistor. In the case where the connection mode of the substrate terminal of the transistor is not specified, the substrate terminal of the transistor may be connected to the ground (for example, zero voltage), but is not limited thereto. In addition, it is to be understood that the word line drive circuit in the disclosure is not limited to the case shown in FIGS. 1-2.

The embodiments of the disclosure provide a memory, which includes the above drive circuit.

The memory includes one or more banks, and each bank includes one or more memory cells. The running state of the bank includes a bank active state and a bank idle state, and may also include other states. For example, in the case where the running state of the bank is the bank active state, the first control circuit pulls down the voltage of the substrate terminal of at least one N-type transistor in the word line drive circuit, reduces the leakage current of the at least one N-type transistor, and improves the leakage in the burn-in test process or working process. In the case where the running state of the memory is the bank idle state, the second control circuit pulls up the voltage of the substrate terminal of the at least one N-type transistor in the word line drive circuit and reduces the threshold voltage of the at least one N-type transistor, so that the word line voltage can be quickly reduced and the word line is turned off.

Figure 15:
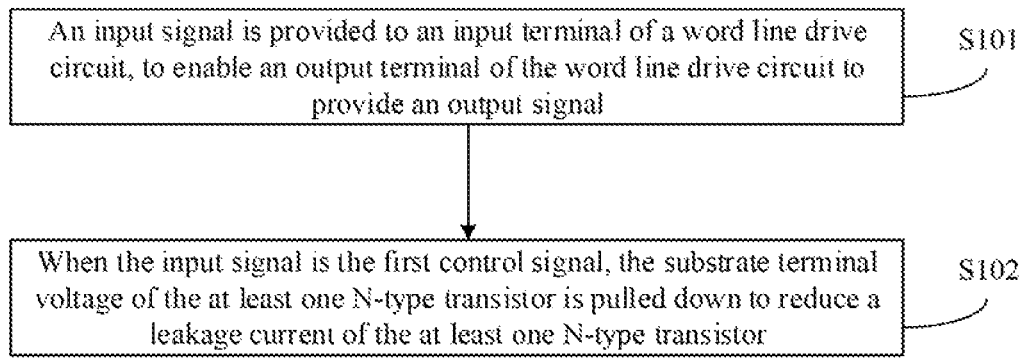
FIG. 15 is a flowchart of a method for driving according to an embodiment of the disclosure.

FIG. 15 is a flowchart of a method for driving according to an embodiment of the disclosure. As shown in FIG. 15, the method for driving a drive circuit according to an embodiment of the disclosure includes the following operations.

In S101, an input signal is provided to an input terminal of a word line drive circuit, to enable an output terminal of the word line drive circuit to provide an output signal.

The drive circuit includes the word line drive circuit and a first control circuit. The input signal is provided to the input terminal of the word line drive circuit, so that the first control circuit pulls down a voltage of a substrate terminal of at least one N-type transistor in the word line drive circuit in the case where the input signal is a first control signal, and reduces the leakage current of the at least one N-type transistor, thereby enabling the output signal provided by the output terminal of the word line drive circuit to effectively reach a word line.

In S102, in the case where the input signal is the first control signal, the voltage of the substrate terminal of the at least one N-type transistor is pulled down to reduce a leakage current of the at least one N-type transistor.

In some embodiments, the word line drive circuit includes a first P-type transistor and a first N-type transistor. A gate electrode of the first P-type transistor and a gate electrode of the first N-type transistor are connected to each other as the input terminal of the word line drive circuit, and a first electrode of the first P-type transistor and a first electrode of the first N-type transistor are connected to each other as the output terminal of the word line drive circuit. The first control circuit includes a second P-type transistor. A gate electrode of the second P-type transistor is connected to the input terminal of the word line drive circuit, a first electrode of the second P-type transistor is connected to the substrate terminal of the first N-type transistor, and a second electrode of the second P-type transistor is connected to a third signal terminal. The third signal terminal is used to provide a third voltage in the case where the second P-type transistor is turned on.

In the case where the input signal is the first control signal, the first N-type transistor is controlled to be turned off, and the second P-type transistor is controlled to be turned on, so that the substrate terminal of the first N-type transistor is connected to the third signal terminal, the third signal terminal provides the third voltage to the substrate terminal of the first N-type transistor, and the third voltage is a low voltage, thereby reducing the voltage of the substrate terminal of the first N-type transistor and reducing the leakage current of the first N-type transistor.

In some embodiments, the word line drive circuit includes a first P-type transistor, a first N-type transistor, and a second N-type transistor. The gate electrode of the second N-type transistor is connected to an input terminal or a control signal terminal of the word line drive circuit, and the control signal terminal provides a third control signal in phase with the input signal. The first electrode of the second N-type transistor is connected to the output terminal of the word line drive circuit, and the second electrode of the second N-type transistor is connected to the second electrode of the first N-type transistor. The first electrode of the second P-type transistor may be connected to the substrate terminal of the first N-type transistor. In the case where the input signal is the first control signal, the first N-type transistor is controlled to be turned off and the second P-type transistor is controlled to be turned on, so that the substrate terminal of the first N-type transistor is connected to the third signal terminal, and the third signal terminal provides the third voltage to pull down the voltage of the substrate terminal of the first N-type transistor and reduce the leakage current of the first N-type transistor. The first electrode of the second P-type transistor may be connected to the substrate terminal of the second N-type transistor. In the case where the input signal is the first control signal, the second N-type transistor is controlled to be turned off, and the second P-type transistor is controlled to be turned on, so that the substrate terminal of the second N-type transistor is connected to the third signal terminal, and the third signal terminal provides the third voltage to pull down the voltage of the substrate terminal of the second N-type transistor and reduce the leakage current of the second N-type transistor. The first electrode of the second P-type transistor may also be connected to the substrate terminal of the first N-type transistor and the substrate terminal of the second N-type transistor. In the case where the input signal is the first control signal, the first N-type transistor and the second N-type transistor are controlled to be turned off, and the second P-type transistor is controlled to be turned on, so that the substrate terminal of the first N-type transistor and the substrate terminal of the second N-type transistor are connected to the third signal terminal, and the third signal terminal provides the third voltage to pull down the voltage of the substrate terminals of the first N-type transistor and the second N-type transistor and reduce the leakage current of the first N-type transistor and the second N-type transistor.

In some embodiments, the drive circuit includes a word line drive circuit, a first control circuit, and a second control circuit. The second control circuit is configured to pull up, in the case where the input signal is a second control signal, the voltage of the substrate terminal of at least one N-type transistor to reduce the threshold voltage of the at least one N-type transistor. The level of the second control signal is different from that of the first control signal. Corresponding, the method for driving may further include the following operation. In the case where the input signal is the second control signal, the voltage of the substrate terminal of the at least one N-type transistor is pulled up to reduce the threshold voltage of the at least one N-type transistor.

For example, the word line drive circuit includes a first N-type transistor and a first P-type transistor, and the second control circuit includes a third N-type transistor. The gate electrode of the third N-type transistor is connected to the input terminal of the word line drive circuit, and the first electrode of the third N-type transistor is connected to the substrate terminal of the first N-type transistor. In the case where the input signal is the second control signal, the third N-type transistor is controlled to be turned on, so that the substrate terminal of the first N-type transistor is connected to a fourth signal terminal, and the fourth signal terminal provides a fourth voltage to pull up the voltage of the substrate terminal of the first N-type transistor, and reduce the threshold voltage of the first N-type transistor.

For example, the word line drive circuit includes a first P-type transistor, a first N-type transistor and a second N-type transistor, and the second control circuit includes a third N-type transistor. The first electrode of the third N-type transistor may be connected to the substrate terminal of the first N-type transistor. In the case where the input signal is the second control signal, the first N-type transistor and the third N-type transistor are controlled to be turned on, so that the substrate terminal of the first N-type transistor is connected to the fourth signal terminal, and the fourth signal terminal provides the fourth voltage to reduce the threshold voltage of the first N-type transistor. The first electrode of the third N-type transistor may be connected to the substrate terminal of the second N-type transistor. In the case where the input signal is the second control signal, the third N-type transistor is controlled to be turned on, and the second N-type transistor is controlled to be turned on under the action of the second control signal or the fourth control signal, so that the substrate terminal of the second N-type transistor is connected to the fourth signal terminal, and the fourth signal terminal provides the fourth voltage to reduce the threshold voltage of the second N-type transistor. The first electrode of the third N-type transistor may be connected to the substrate terminal of the first N-type transistor and the substrate terminal of the second N-type transistor. In the case where the input signal is the second control signal, the first N-type transistor and the third N-type transistor are controlled to be turned on, and the second N-type transistor is controlled to be turned on under the action of the second control signal or the fourth control signal, so that the substrate terminal of the first N-type transistor and the substrate terminal of the second N-type transistor are connected to the fourth signal terminal, and the fourth signal terminal provides the fourth voltage to reduce the threshold voltages of the first N-type transistor and the second N-type transistor.

In the above technical solutions, the drive circuit includes a word line drive circuit and a first control circuit. The word line drive circuit provides an output signal to an output terminal according to an input signal received by an input terminal. The first control circuit pulls down the voltage of the substrate terminal of at least one N-type transistor in the word line drive circuit in the case where the input signal is the first control signal, to reduce the leakage current of the at least one N-type transistor, so that a high-level signal output by the word line drive circuit can effectively reach the word line, the leakage of the N-type transistor in the word line drive circuit can be improved, and the performance of the memory can be further improved.

It should be understood that the disclosure is not limited to the precise structures described above and illustrated in the drawings, and various modifications and variations may be made without departing from the scope thereof. The scope of the disclosure is only subject to the appended claims.

What is claimed is:
1. A drive circuit, comprising:
a word line drive circuit, comprising an input terminal and an output terminal and configured to provide an output signal to the output terminal according to an input signal received by the input terminal, the word line drive circuit comprising at least one N-type transistor; and
a first control circuit, configured to pull down, in response to the input signal being a first control signal, a voltage of a substrate terminal of the at least one N-type transistor to reduce a leakage current of the at least one N-type transistor;
wherein the first control circuit comprises a second P-type transistor, and the second P-type transistor comprises a gate electrode connected to the input terminal of the word line drive circuit, a first electrode connected to the substrate terminal of the at least one N-type transistor, and a second electrode connected to a third signal terminal,
wherein the third signal terminal is configured to provide a third voltage in a case where the second P-type transistor is turned on.

2. The drive circuit of claim 1, wherein the third voltage is lower than zero voltage.

3. The drive circuit of claim 1, wherein the word line drive circuit comprises a first P-type transistor and a first N-type transistor,
a gate electrode of the first P-type transistor and a gate electrode of the first N-type transistor are connected to each other and used as the input terminal of the word line drive circuit,
a first electrode of the first P-type transistor and a first electrode of the first N-type transistor are connected to each other and used as the output terminal of the word line drive circuit, and
a substrate terminal of the first N-type transistor is connected to the first electrode of the second P-type transistor.

4. The drive circuit of claim 3, wherein a second electrode of the first P-type transistor is connected to a first signal terminal, and a second electrode of the first N-type transistor is connected to a second signal terminal,
wherein the first signal terminal is configured to provide a first voltage in a case where the first P-type transistor is turned on, and the second signal terminal is configured to provide a second voltage in a case where the first N-type transistor is turned on, and
the first voltage is greater than the second voltage.

5. The drive circuit of claim 4, wherein the word line drive circuit further comprises:
a second N-type transistor, comprising a first electrode connected to the output terminal of the word line drive circuit, a second electrode connected to the second electrode of the first N-type transistor, and a gate electrode connected to the input terminal or a control signal terminal of the word line drive circuit,
wherein the control signal terminal is configured to provide a control signal in phase with the input signal.

6. The drive circuit of claim 5, wherein a substrate terminal of the second N-type transistor is connected to the first electrode of the second P-type transistor.

7. The drive circuit of claim 5, further comprising:
a second control circuit, configured to pull up, in response to the input signal being a second control signal, the voltage of the substrate terminal of the at least one N-type transistor to reduce a threshold voltage of the at least one N-type transistor,
wherein a level of the second control signal is different from that of the first control signal.

8. The drive circuit of claim 7, wherein the level of the first control signal is lower than that of the second control signal.

9. The drive circuit of claim 7, wherein the second control circuit comprises a third N-type transistor, and the third N-type transistor comprises a gate electrode connected to the input terminal of the word line drive circuit, a first electrode connected to the substrate terminal of the at least one N-type transistor, and a second electrode connected to a fourth signal terminal,
wherein the fourth signal terminal is configured to provide a fourth voltage in a case where the third N-type transistor is turned on.

10. The drive circuit of claim 9, wherein the fourth voltage is greater than the third voltage.

11. The drive circuit of claim 9, wherein the first electrode of the third N-type transistor is connected to the substrate terminal of the first N-type transistor and the substrate terminal of the second N-type transistor.

12. The drive circuit of claim 1, wherein the input terminal of the word line drive circuit is connected to a main word line, and the output terminal of the word line drive circuit is connected to a word line.

13. A memory, comprising a drive circuit and a bank, the bank comprising one or a plurality of memory cells, the drive circuit comprising:
a word line drive circuit, comprising an input terminal and an output terminal and configured to provide an output signal to the output terminal according to an input signal received by the input terminal, the word line drive circuit comprising at least one N-type transistor; and
a first control circuit, configured to pull down, in response to the input signal being a first control signal, a voltage of a substrate terminal of the at least one N-type transistor to reduce a leakage current of the at least one N-type transistor;
wherein the first control circuit comprises a second P-type transistor, and the second P-type transistor comprises a gate electrode connected to the input terminal of the word line drive circuit, a first electrode connected to the substrate terminal of the at least one N-type transistor and a second electrode connected to a third signal terminal,
wherein the third signal terminal is configured to provide a third voltage in a case where the second P-type transistor is turned on;
in a case where a running state of the bank is a bank active state, the first control circuit pulls down the voltage of the substrate terminal of the at least one N-type transistor in the word line drive circuit.

14. A method for driving a drive circuit of claim 1, comprising:
providing an input signal to an input terminal of a word line drive circuit in the drive circuit, to enable an output terminal of the word line drive circuit to provide an output signal; and
pulling down, in response to the input signal being a first control signal, a voltage of a substrate terminal of at least one N-type transistor in the word line drive circuit to reduce a leakage current of the at least one N-type transistor.

15. The method of claim 14, wherein the drive circuit further comprises:
a second control circuit, configured to pull up, in response to the input signal being a second control signal, the voltage of the substrate terminal of the at least one N-type transistor to reduce a threshold voltage of the at least one N-type transistor, wherein a level of the second control signal is different from that of the first control signal,
wherein the method further comprises:
pulling up, in response to the input signal being the second control signal, the voltage of the substrate terminal of the at least one N-type transistor to reduce the threshold voltage of the at least one N-type transistor.

16. The method of claim 15, wherein the word line drive circuit comprises a first P-type transistor and a first N-type transistor, a gate electrode of the first P-type transistor and a gate electrode of the first N-type transistor are connected to each other and used as the input terminal of the word line drive circuit, and a first electrode of the first P-type transistor and a first electrode of the first N-type transistor are connected to each other and used as the output terminal of the word line drive circuit;

wherein the second control circuit comprises a third N-type transistor, and the third N-type transistor comprises a gate electrode connected to the input terminal of the word line drive circuit, a first electrode connected to the substrate terminal of the first N-type transistor, and a second electrode connected to a fourth signal terminal, the fourth signal terminal being configured to provide a fourth voltage in a case where the third N-type transistor is turned on;

wherein pulling up, in response to the input signal being the second control signal, the voltage of the substrate terminal of the at least one N-type transistor to reduce the threshold voltage of the at least one N-type transistor comprises:

controlling, in response to the input signal being the second control signal, the third N-type transistor to be turned on, to enable the substrate terminal of the first N-type transistor to be connected to the fourth signal terminal to reduce the threshold voltage of the first N-type transistor.

17. The method of claim 15, wherein the word line drive circuit comprises a first P-type transistor, a first N-type transistor, and a second N-type transistor, a gate electrode of the first P-type transistor and a gate electrode of the first N-type transistor are connected to each other and used as the input terminal of the word line drive circuit, a first electrode of the first P-type transistor and a first electrode of the first N-type transistor are connected to each other and used as the output terminal of the word line drive circuit, a gate electrode of the second N-type transistor is connected to the input terminal or a control signal terminal of the word line drive circuit, a first electrode of the second N-type transistor is connected to the output terminal of the word line drive circuit, a second electrode of the second N-type transistor is connected to the second electrode of the first N-type transistor, and the control signal terminal is configured to provide a control signal in phase with the input signal, wherein the second control circuit comprises a third N-type transistor, and the third N-type transistor comprises a gate electrode connected to the input terminal of the word line drive circuit, a first electrode connected to at least one of the substrate terminal of the first N-type transistor or the substrate terminal of the second N-type transistor, and a second electrode connected to a fourth signal terminal, the fourth signal terminal being configured to provide a fourth voltage in a case where the third N-type transistor is turned on;

wherein pulling up, in response to the input signal being the second control signal, the voltage of the substrate terminal of the at least one N-type transistor to reduce the threshold voltage of the at least one N-type transistor comprises:

controlling, in response to the input signal being the second control signal, the third N-type transistor to be turned on, to enable at least one of the substrate terminal of the first N-type transistor or the substrate terminal of the second N-type transistor to be connected to the fourth signal terminal, and pulling up the voltage of the substrate terminal of at least one of the first N-type transistor or the second N-type transistor to reduce the threshold voltage of at least one of the first N-type transistor or the second N-type transistor.

18. The method of claim 14, wherein the word line drive circuit comprises a first P-type transistor and a first N-type transistor, a gate electrode of the first P-type transistor and a gate electrode of the first N-type transistor are connected to each other and used as the input terminal of the word line drive circuit, and a first electrode of the first P-type transistor and a first electrode of the first N-type transistor are connected to each other and used as the output terminal of the word line drive circuit;

wherein a first control circuit in the drive circuit comprises a second P-type transistor, and the second P-type transistor comprises a gate electrode connected to the input terminal of the word line drive circuit, a first electrode connected to a substrate terminal of the first N-type transistor, and a second electrode connected to a third signal terminal, the third signal terminal being configured to provide a third voltage in a case where the second P-type transistor is turned on;

wherein pulling down, in response to the input signal being the first control signal, the voltage of the substrate terminal of the at least one N-type transistor to reduce the leakage current of the at least one N-type transistor comprises:

controlling, in response to the input signal being the first control signal, the second P-type transistor to be turned on, to enable the substrate terminal of the first N-type transistor to be connected to the third signal terminal, and pulling down the voltage of the substrate terminal of the first N-type transistor to reduce the leakage current of the first N-type transistor.

19. The method of claim 14, wherein the word line drive circuit comprises a first P-type transistor, a first N-type transistor, and a second N-type transistor, a gate electrode of the first P-type transistor and a gate electrode of the first N-type transistor are connected to each other and used as the input terminal of the word line drive circuit, a first electrode of the first P-type transistor and a first electrode of the first N-type transistor are connected to each other and used as the output terminal of the word line drive circuit, a gate electrode of the second N-type transistor is connected to the input terminal or a control signal terminal of the word line drive circuit, a first electrode of the second N-type transistor is connected to the output terminal of the word line drive circuit, a second electrode of the second N-type transistor is connected to the second electrode of the first N-type transistor, and the control signal terminal is configured to provide a control signal in phase with the input signal;

wherein a first control circuit comprises a second P-type transistor, and the second P-type transistor comprises a gate electrode connected to the input terminal of the word line drive circuit, a first electrode connected to at least one of a substrate terminal of the first N-type transistor or a substrate terminal of the second N-type transistor, and a second electrode connected to a third signal terminal, the third signal terminal being configured to provide a third voltage in a case where the second P-type transistor is turned on;

wherein pulling down, in response to the input signal being the first control signal, the voltage of the substrate terminal of the at least one N-type transistor to reduce the leakage current of the at least one N-type transistor comprises:

controlling, in response to the input signal being the first control signal, the second P-type transistor to be turned on, to enable at least one of the substrate terminal of the first N-type transistor or the substrate terminal of the second N-type transistor to be connected to the third signal terminal, and pulling down the voltage of the substrate terminal of at least one of the first N-type transistor or the second N-type transistor to reduce the leakage current of at least one of the first N-type transistor or the second N-type transistor.

* * * * *